(12) United States Patent
Rao et al.

(10) Patent No.: US 7,979,837 B1
(45) Date of Patent: *Jul. 12, 2011

(54) CALCULATING DISTORTION SUMMARIES FOR CIRCUIT DISTORTION ANALYSIS

(75) Inventors: Fangyi Rao, San Jose, CA (US); Dan Feng, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 60 days.

This patent is subject to a terminal disclaimer.

(21) Appl. No.: 12/484,865

(22) Filed: Jun. 15, 2009

Related U.S. Application Data

(62) Division of application No. 11/640,137, filed on Dec. 14, 2006, now Pat. No. 7,571,401.

(60) Provisional application No. 60/750,706, filed on Dec. 14, 2005.

(51) Int. Cl.
*G06F 17/50* (2006.01)
*G06F 9/45* (2006.01)
*G06F 11/22* (2006.01)

(52) U.S. Cl. .......... 716/136; 716/100; 716/108; 703/12; 703/13; 703/14

(58) Field of Classification Search .............. 716/1, 4, 716/6, 100, 108, 136; 703/12, 13, 14
See application file for complete search history.

(56) References Cited

U.S. PATENT DOCUMENTS

| | | | |
|---|---|---|---|
| 5,663,890 A | 9/1997 | Saleh et al. | |
| 6,529,844 B1 | 3/2003 | Kapetanic et al. | |
| 7,400,129 B1 | 7/2008 | Prather | |
| 7,571,401 B1 | 8/2009 | Rao et al. | |
| 7,774,176 B2 | 8/2010 | Rao et al. | |
| 2003/0179041 A1 | 9/2003 | Weldon | |
| 2003/0222652 A1 | 12/2003 | Martens | |
| 2004/0083437 A1 | 4/2004 | Gullapalli et al. | |
| 2004/0169559 A1 | 9/2004 | Weldon | |
| 2004/0171351 A1 | 9/2004 | Nakazawa et al. | |
| 2005/0021319 A1 | 1/2005 | Li et al. | |
| 2005/0271130 A1 | 12/2005 | Howard | |
| 2007/0136045 A1 | 6/2007 | Rao et al. | |

OTHER PUBLICATIONS

J. Bussgang, L. Ehrman, and J. Graham. Analysis of nonlinear systems with multiple inputs. Proc. IEEE, 62:1088-1119, Aug. 1974.
S. Chisholm and L. Nagel. Efficient computer simulation of distortion in electronic circuits. IEEE Trans. on Circuits and Systems, 20(6):742-745, Nov. 1973.
P. Feldmann, B. Melville, and D. Long. Efficient frequency domain analysis of large nonlinear analog circuits. Proc. Custom Integrated Circuits Conf., pp. 461-464, 1996.
J. Haywood and Y. L. Chow. Intermodulation distortion analysis using a frequency-domain harmonic balance technique. IEEE Trans. on Microwave Theory and Techniques, 36(8):1251-1257, Aug. 1988.
Y. Kuo. Distortion analysis of bipolar transistor circuits. IEEE Trans. on Circuits and Systems, 20(6):709-716, Nov. 1973.

(Continued)

*Primary Examiner* — Thuan Do
*Assistant Examiner* — Magid Y Dimyan
(74) *Attorney, Agent, or Firm* — Schwegman, Lundberg & Woessner, P.A.

(57) ABSTRACT

Methods for analyzing circuit distortion based on contributions from separate circuit elements are presented. Local approximations that do not require high-order derivatives of device models are developed near an operating point for calculating distortion summaries including compression summaries and second-order intermodulation (IM2) distortion summaries.

20 Claims, 6 Drawing Sheets

OTHER PUBLICATIONS

B. Leon and D. Schaefer. Volterra series and picard iteration for nonlinear circuits and systems. IEEE Trans. on Circuits and Systems, 25(9):789-793, Sep. 1978.

P. Li and L. Pileggi. Efficient per-nonlinearity distortion analysis for analog and rf circuits. IEEE Trans. on Computer-Aided Design of Integrated Circuits and Systems, 22(10):1297-1309, Oct. 2003.

S. Narayanan. Application of volterra series to intermodulation distortion analysis of transistor feedback amplifiers. IEEE Trans. on Circuits and Systems, 17(4):518-527, Nov. 1970.

R. Telichevesky, K. Kundert, and J. White. Efficient ac and noise analysis of two-tone rf circuits. Proc. of 33th DAC pp. 292-297, Jun. 1996.

P. Wambacq, G. Gielen, P. Kinget, and W. Sansen. High-frequency distortion analysis of analog integrated circuits. IEEE Trans. on Circuits and Systems II, 46(3):335-345, Mar. 1999.

F. Yuan and A. Opal. Distortion analysis of periodically switched nonlinear circuits using time-varying volterra series. IEEE Trans. on Circuits and Systems I, 48(6):726-738, Jun. 2001.

D. Long, R. Melville, K. Ashby, and B. Horton. Full-chip Harmonic Balance. Custom Integrated Circuits Conference, 1997, Proceedings of the IEEE 1997, May 5-8, 1997, pp. 379-382.

U.S. Appl. No. 11/303,049, filed Dec. 14, 2005; Inventor Fangyi Rao.

"U.S. Appl. No. 11/303,049, Non Final Office Action mailed Apr. 1, 2009", 9 pgs.

"U.S. Appl. No. 11/303,049, Non Final Office Action mailed Aug. 18, 2009", 10 pgs.

"U.S. Appl. No. 11/303,049, Notice of Allowance mailed Apr. 2, 2010", 4 pgs.

"U.S. Appl. No. 11/303,049, Response filed May 19, 2009 to Non Final Office Action mailed Apr. 1, 2009", 19 pgs.

"U.S. Appl. No. 11/303,049, Response filed Dec. 18, 2009 to Non Final Office Action mailed Sep. 18, 2009", 20 pgs.

"U.S. Appl. No. 11/303,049, Supplemental Non Final Office Action mailed Sep. 18, 2009", 10 pgs.

"U.S. Appl. No. 11/640,137, Amendment after allowance under 37 CFR 1.312 mailed Jun. 12, 2009", 5 pgs.

"U.S. Appl. No. 11/640,137, Notice of Allowance mailed Mar. 16, 2009", 7 pgs.

"U.S. Appl. No. 11/640,137, Response filed Jan. 16, 2009 to Restriction Requirement mailed Dec. 19, 2008", 7 pgs.

"U.S. Appl. No. 11/640,137, Response filed Jun. 18, 2009 to Amendment after Final or under 37 CFR 1.312 mailed Jun. 12, 2009", 2 pgs.

"U.S. Appl. No. 11/640,137, Restriction Requirement mailed Dec. 19, 2008", 6 pgs.

Feng, D, et al., "Efficient computation of quasi-periodic circuit operating conditions via a mixed frequency/time approach", Proceedings of the 36th Annual ACM / IEEE Design Automation Conference (Jun. 1999), 635-640.

Compression distortion summary (in dB) of mixer ne600 at −15dbm at node Pif

|  | shooting-based | HB-based |
|---|---|---|
| all devices | −0.0119673 | −0.0112060 |
| q57 | −0.00390504 | −0.00393246 |
| q58b | −0.00242960 | −0.00242944 |
| q58a | −0.00242960 | −0.00242944 |
| q56 | 0.00226582 | 0.00298844 |

*FIG. 3*

**Compression distortion summary
(in dB) of PA at 0.1V at node RFOUT**

| | |
|---|---|
| all devices | −0.0168694 |
| I2.Q2 | −0.0272125 |
| I4.Q2 | −0.0167551 |
| I4.Q0 | 1.04902e-06 |
| I2.Q0 | 6.50198e-06 |
| I4.Q1 | 0.00548814 |
| I2.Q1 | 0.0218572 |

*FIG. 4*

IM2 distortion summary (in V) for a direct conversion mixer
at −20dbm between nodes out1 and out 2

|       | shooting-based | HB-based     |
|-------|----------------|--------------|
| total | 0.000135867    | 0.000129093  |
| Q5    | 0.000227264    | 0.000208379  |
| Q4    | 0.000176215    | 0.000166996  |
| Q3    | 0.000229649    | 0.000236650  |
| Q2    | 0.000175046    | 0.000180102  |
| Q1    | 3.39998e-06    | 4.19775e-06  |
| Q0    | 3.18766e-06    | 2.32853e-06  |
| Q7    | 2.36784e-05    | 2.46841e-05  |
| Q6    | 6.22719e-10    | 5.34738e-10  |

FIG. 6

CALCULATING DISTORTION SUMMARIES FOR CIRCUIT DISTORTION ANALYSIS

CROSS-REFERENCE TO RELATED APPLICATIONS

This application is a divisional of application Ser. No. 11/640,137, filed Dec. 14, 2006, which is incorporated herein by reference in its entirety. This application claims the benefit of U.S. Provisional Application No. 60/750,706, filed Dec. 14, 2005, which is incorporated herein by reference in its entirety.

BACKGROUND OF THE INVENTION

The present invention relates to the analysis of circuits generally and more particularly to the distortion analysis of analog and RF (Radio Frequency) circuits by calculating distortion contributions of individual circuit elements.

Circuit linearity is a critical specification in analog and RF designs. Intermodulation product and compression are two commonly adopted measures for distortion [6, 11]. As a result, a general methodology for analyzing effects of individual components on circuit distortion and for identifying the major sources of nonlinearity is of practical importance in complex designs. From the designer point of view, it is desirable to separate total distortion into contributions of different elements. While in general such a separation is not possible for most nonlinear effects because of cross terms between devices, insights on distortion dependency on nonlinearity in a single device can still be obtained by conducting some heuristic analysis. At low RF power levels, perturbation methods based on Volterra series can be applied to calculate nonlinear effects [10, 2, 5, 1, 9, 4, 14, 15]. This approach can provide relatively detailed information related to distortion caused by different nonlinear terms in different elements.

A drawback of the Volterra method is that it generally requires high order device derivatives, which usually are not provided by device models used in real design simulations. As a result, the application of Volterra series has typically been limited to simple models and simple circuits. To circumvent this difficulty, Li and Pileggi proposed a post-simulation post-processing approach based on linear-centric circuit models, where the nonlinear current of an element is computed by subtracting the current in a linearized device model from the total current calculated by full device model evaluation [8]. According to this approach, the terminal voltage used for device evaluations is taken from the steady state solution which includes nonlinear effects of the whole circuit. Therefore, the nonlinear current obtained contains cross terms implicitly and is not totally independent of other elements.

In general, current methods do not adequately model circuit distortion in terms of contributions from separate device elements. Thus, there is a need for improved methods and systems for circuit distortion analysis, especially with applications to analog and RF circuits.

SUMMARY OF THE INVENTION

In one embodiment of the present invention, a method of analyzing distortion in a circuit includes: determining an operating point for the circuit, where the circuit has a linear offset and a nonlinear offset for analyzing distortion at the operating point; determining first-order output values by using the linear offset to relate an input having an input frequency with the first-order output values; specifying one or more devices for analyzing the circuit; determining first nonlinear-offset values for the one or more devices at twice the input frequency and at a zero frequency by evaluating the nonlinear offset at values based on the first-order output values; determining second-order output values for the one or more devices at twice the input frequency and at the zero frequency by using the linear offset to relate the second-order output values with the first nonlinear-offset values; determining second nonlinear-offset values for the one or more devices at the input frequency by evaluating the nonlinear offset at values based on the first order-order output values and the second-order output values; determining third-order output values for the one or more devices at the input frequency by using the linear offset to relate the third-order output values with the second nonlinear-offset values; and saving at least some values based on the output values.

According to one aspect of this embodiment, determining the operating point for the circuit may include approximating the operating point by a time-domain method or a frequency-domain method so that the linear offset defines a linear function for inputs about the operating point and the nonlinear offset defines a nonlinear function for inputs about the operating point.

According to another aspect, the method may further include determining one or more compression summaries for the one or more devices by calculating one or more comparisons between third-order output values and corresponding first-order output values. Additionally, calculating the one or more comparisons may include calculating logarithmic ratios between third-order output values and corresponding first-order output values.

In another embodiment of the present invention, a method of analyzing distortion in a circuit includes: determining an operating point for the circuit, where the circuit has a linear offset and a nonlinear offset for analyzing distortion at the operating point; determining first-order output values by using the linear offset to relate an input having a first frequency and a second frequency with the first-order output values; specifying one or more devices for analyzing the circuit; determining nonlinear-offset values for the one or more devices at a difference between the first frequency and the second frequency by evaluating the nonlinear offset at values based on the first order-order output values; determining contributions to distortion for the one or more devices by projecting the nonlinear-offset values based on the difference between the first frequency and the second frequency; and saving at least some values based on the contributions to distortion for the one or more devices.

According to one aspect of this embodiment, determining the operating point for the circuit may include approximating the operating point by a time-domain method or a frequency-domain method so that the linear offset defines a linear function for inputs about the operating point and the nonlinear offset defines a nonlinear function for inputs about the operating point.

According to another aspect, the method may further include determining a second-order intermodulation (IM2) distortion summary for the one or more devices by combining the contributions to distortion for the one or more devices. Additionally, combining the contributions to distortion for the one or more devices may include summing the contributions to distortion for the one or more devices.

According to another aspect, the method may further include determining a transfer function that projects the nonlinear-offset values onto one or more output nodes of the system for calculating the contributions to distortion for the one or more devices. Additionally, projecting the nonlinear-offset values may include calculating one or more inner products between the transfer function and the nonlinear offset values.

Additional embodiments relate to an apparatus for carrying out any one of the above-described methods, where the apparatus may include a computer for executing instructions related to the method. For example, the computer may include a processor with memory for executing at least some of the instructions. Additionally or alternatively the computer may include a specialized microprocessor or other hardware for executing at least some of the instructions. Additional embodiments also relate to a computer-readable medium that stores (e.g., tangibly embodies) a computer program for carrying out any one of the above-described methods with a computer.

In this way the present invention enables improved methods and systems for circuit distortion analysis with applications to analog and RF circuits.

BRIEF DESCRIPTION OF THE DRAWINGS

FIG. 3 shows computed values related to the embodiment shown in FIG. 2.

FIG. 4 shows computed values related to the embodiment shown in FIG. 2.

FIG. 6 shows computed values related to the embodiment shown in FIG. 5.

DETAILED DESCRIPTION OF EXEMPLARY EMBODIMENTS

1. Introduction

Figure 1:
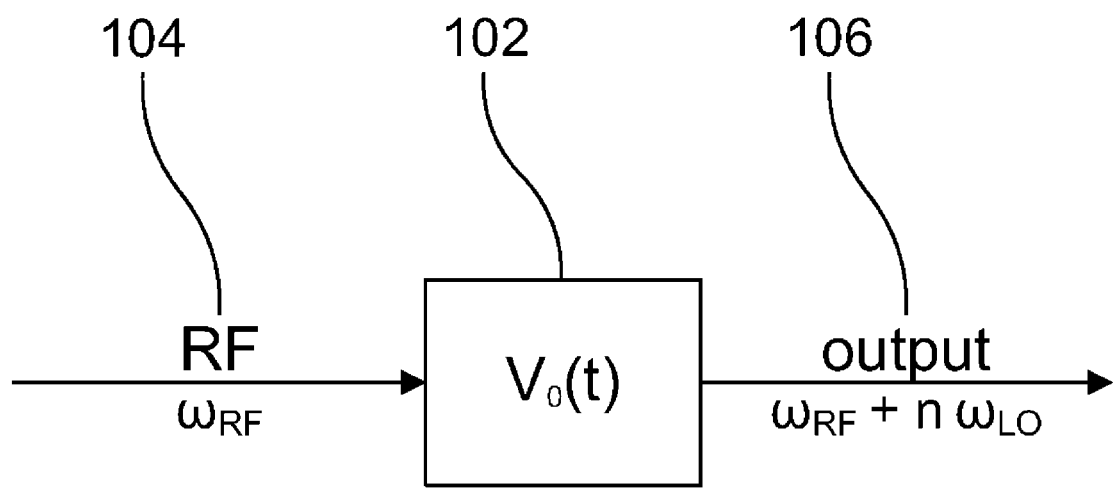
FIG. 1 shows an exemplary system which is applicable to embodiments of the present invention.

FIG. 1 shows a system 102 (e.g., a circuit model) that receives an RF input 104 with an input frequency $\omega_{RF}$ and produces an output 106 where the input frequency has been modulated by the system (e.g., shifted by a multiple of the LO (Local Oscillator) frequency $\omega_{LO}$. Under non-ideal conditions, the output 106 includes distortions due to the nonlinear effects in the system 102. As described below, the present invention enables quantitative characterizations of how component devices contribute to distortion in the output signal 106. Specific embodiments include calculations for compression distortion and second-order intermodulation products (IM2). This application is related to CALCULATING INTERMODULATION PRODUCTS AND INTERCEPT POINTS FOR CIRCUIT DISTORTION ANALYSIS (application Ser. No. 11/303,049, filed Dec. 14, 2005), which is incorporated herein by reference in its entirety.

2. Compression Distortion Summary

The circuit 102 in FIG. 1 has a periodic time-dependent operating point $V_0(t)$ at the LO frequency $\omega_{LO}$ More generally, systems with DC (direct current) operating points such as an LNA (Low Noise Amplifier) can be considered as special cases with $\omega_{LO}=0$. When the RF input signal 104 is applied, the output signal 106 at $\omega_{RF}+n\omega_{LO}$ is a function of the input magnitude $V_{RF}$ and given as:

$$V_{out}(\omega_{RF}+n\omega_{LO})=c_1 V_{RF}+c_3 V_{RF}^3+ \qquad (1)$$

The first term on the right-hand side of eq. (1) is the linear response to RF input, and the coefficient $c_1$ can be obtained by small signal calculation. Other terms model distortion due to third and higher order terms in the nonlinear response. The compression distortion can be measured in dB (decibels) as $$dB = 10 \cdot \log\left(\frac{V_{out}}{c_1 V_{RF}}\right). \qquad (2)$$

While it's desirable to know the contribution of each individual device to total compression, it is mathematically intractable to make such a separation for third or higher order nonlinearities. In order to quantify the effect of a specific device on the nonlinear response at the output signal, we assume the rest of the circuit responds to the RF signal linearly and compute the distortion in the output caused solely by nonlinear response at this device. With this approach, although the circuit is hypothetical, the result provides useful information about how sensitive distortion is to the device. The effects of the device on the nonlinear response and the transfer function from device nodes to output nodes are reflected in the calculation.

Notably, since the operating point is time-dependent, all the other devices are still nonlinear in the calculations. Only their response to RF signal is linearized. In particular, for mixer cases, transistors in LO block still function nonlinearly to generate the clock signal. However, their contribution to the output distortion summary is expected to be very small because the RF signal 104 usually does not disturb the LO part of the circuit. Both linear and nonlinear responses in LO block are typically almost zero.

We formulate compression distortion summary calculations by writing circuit equation as $$\frac{d}{dt}q(v(t)) + i(v(t)) = B(t) + s(t), \qquad (3)$$

where B is the operating point source such as LO at $\omega_{LO}$ and s is RF input signal at $\omega_{RF}$ [13]. For simplicity, we rewrite eq. (3) as $$F(v)=B+s. \qquad (4)$$

Assume $V_0(t)$ is the steady-state (or DC) solution at zero RF input so that $V_0$ satisfies equation $$F(V_0(t))=B(t). \qquad (5)$$

Next, expanding eq. (4) around $V_0$ gives $$L \cdot v + F_{NL}(v) = s, \qquad (6)$$

where v is the circuit response to RF signal s. The linear operator L in the first term is defined as $$L \cdot v = \frac{d}{dt}\left(\frac{\partial}{\partial v}q(V_0) \cdot v\right) + \frac{\partial}{\partial v}i(V_0) \cdot v \qquad (7)$$

and $L \cdot v$ is just the linearized LHS of eq. (3). The second term $F_{NL}$ represents the sum of nonlinear terms in all the devices and is defined as $$F_{NL}(V_0,v)=F(V_0+v)-F(V_0)-L \cdot v. \qquad (8)$$

That is, linearizing about the DC or operating point $V_0$ determines linear and nonlinear offsets (or offset functions), L and $F_{NL}$, for analyzing local perturbations of the output.

The linear response $v^{(1)}$ is given by equation $$L \cdot v^{(1)} = s \qquad (9)$$

Note that $F_{NL}$ is the sum of nonlinear contribution from each device. To calculate distortion caused solely by device d, we omit $F_{NL}$ in all other devices except in d. Eq. (6) then becomes $$L \cdot v + F_{NL}^{(d)}(v) = s \qquad (10)$$

Compression due to d is computed with v and $v^{(1)}$ at frequency $\omega_{RF} + n\omega_{LO}$ (n is an integer):

$$dB = 10 \cdot \log\left[\frac{v(\omega_{RF} + n\omega_{LO})}{v^{(1)}(\omega_{RF} + n\omega_{LO})}\right] \qquad (11)$$

In most analog designs, the circuit functions in a nearly linear region. The nonlinear term $F_{NL}^{(d)}$ in eq. (10) is small compared to the linear term $L \cdot v$ and v is not far away from $v^{(1)}$. Therefore, we can treat $F_{NL}^{(d)}$ as perturbation and apply Born approximation to solve v iteratively $$u^{(n)} = v^{(1)} - L^{-1} \cdot F_{NL}^{(d)}(u^{(n-1)}), \qquad (12)$$

where $u^{(n)}$ is the approximated v accurate up to nth order of $V_{RF}$ for $n \geq 2$ and $u^{(1)}$ is the same as $v^{(1)}$. Eq. (12) is equivalent to AC or periodic AC analysis with $F_{NL}^{(d)}(v^{(n-1)})$ being the small signal. As shown in eq. (8), evaluation of $F_{NL}^{(d)}$ takes a function evaluation of F at device d and its first derivative. No modification is needed in the device model. In compression distortion summary, we solve v up to 3rd order perturbation and use $u^{(3)}$ as v in eq. (11).

To simplify eq. (12) we define RF harmonic of a multi-tone function $f(t)$ as $$f_\omega(t) = \sum_m f(\omega + m\omega_{LO}) e^{j(\omega + m\omega_{LO})t} \qquad (13)$$

where $\omega$ is the frequency a particular RF harmonic and $f(\omega m\omega_{LO})$ is the Fourier transform of $f(t)$. Eq. (12) can be written in RF harmonic form as $$u_\omega^{(n)} = v_\omega^{(1)} - L^{-1} \cdot F_{NL,\omega}^{(d)}(u^{(n-1)}) \qquad (14)$$

RF harmonic $F_{NL,\omega}^{(d)}$ of $F_{NL}^{(d)}$ can be obtained by DFT (Discrete Fourier Transform).

For compression distortion, we solve (14) at the first RF harmonic $\omega = \omega_{RF}$ to 3rd order.

$$u_{\omega_{RF}}^{(3)} = v_{\omega_{RF}}^{(1)} - L^{-1} \cdot F_{NL,\omega_{RF}}^{(d)}(u^{(2)}) \qquad (15)$$

Notice that as defined in (8) $F_{NL}(v)$ is the nonlinear part of function F (v) and its lowest order polynomial is $v^2$. Third order terms in $u_{\omega_{RF}}^{(3)}$ equation arise from 2nd and 3rd in (and polynomials in $F_{NL}$ which involve only RF harmonics at $\omega_{RF}$ and $-\omega_{RF}$ in $v^{(1)}$ and $2\omega_{RF}$ and 0 in $u^{(2)}$.

Thus, without losing accuracy we can write eq. (15) as $$u_{\omega_{RF}}^{(3)} = v_{\omega_{RF}}^{(1)} - L^{-1} \cdot F_{NL,\omega_{RF}}^{(d)}(v_{\omega_{RF}}^{(1)} + v_{-\omega_{RF}}^{(1)} + u_{2\omega_{RF}}^{(2)} + u_0^{(2)}) \qquad (16)$$

Eq. (16) shows that to solve $u_{\omega_{RF}}^{(3)}$ at third order we only need to solve $u_{2\omega_{RF}}^{(2)}$ and $u_0^{(2)}$ in second-order Born approximation, for which we have $$u_{2\omega_{RF}}^{(2)} = -L^{-1} \cdot F_{NL,2\omega_{RF}}^{(d)}(v^{(1)}) \qquad (17)$$

and $$u_0^{(2)} = -L^{-1} \cdot F_{NL,0}^{(d)}(v^{(1)}). \qquad (18)$$

Other RF harmonics in $u^{(2)}$ contribute to higher order terms, and therefore can be ignored in 3rd order perturbation. (Note that in eq. (16) $v_{\omega_{RF}}^{(1)}$ and $v_{-\omega_{RF}}^{(1)}$ are complex conjugates so that only one solution must be obtained.)

Figure 2:
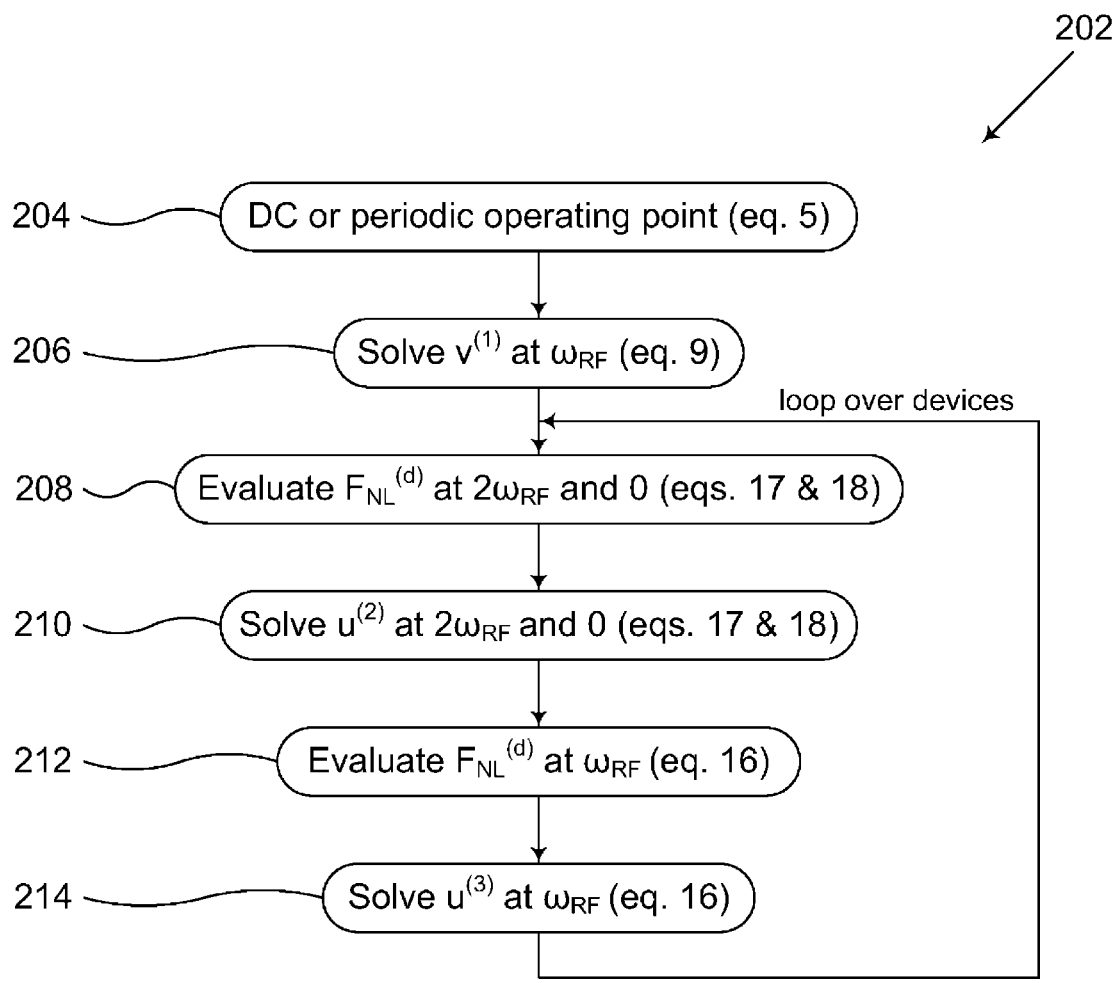
FIG. 2 shows an exemplary method for computing compression distortion summaries.

FIG. 2 shows a method for calculating a compression distortion summary 202 consistent with the above discussion. First, a DC or operating point is determined 204 (e.g., approximated in the time domain [13] or the frequency domain [16]). Next eq. (9) is solved for the first-order linear response $v^{(1)}$ at $\omega_{RF}$ 206. Note that eq. (9) can be solved in the time domain [13] or alternatively in the frequency domain [16] by standard methods.

The process then continues for one or more devices (e.g, component elements d of the system 102). First the nonlinear terms are calculated at frequencies $2\omega_{RF}$ and zero 208. Next, second-order solutions are calculated for these frequencies 210. Next the nonlinearities in Eq. (16) are evaluated at $\omega_{RF}$ 212, and the equation is solved for the third-order solution $u^{(3)}$ 214. This process can be continued for all devices in the system 102 or a limited subset of component devices.

Simulation results corresponding to an implementation of this method are shown in FIGS. 3 and 4. FIG. 3 shows a compression distortion summary (in dB) for mixer ne600 (Philips Semiconductors) at −15 dbm at node Pif. Compressions due to all devices and due to each individual device are listed. Results based on time-domain shooting and harmonic-balance implementations are given and they are consistent with each other. FIG. 4 shows similar results (based on time-domain shooting) for a compression distortion summary (in dB) of a PA (Power Amplifier) at 0.1V at node RFOUT.

3. IM2 Distortion Summary

In direct conversion mixer design, second-order intermodulation (IM2) between two RF input signals is used to measure circuit distortion. As a second order effect, IM2 does not involve crossing nonlinear terms between devices. It is simply the sum of second order terms in each individual device. This can be demonstrated by second order Born approximation for IM2 at frequency $\omega_1 - \omega_2$ where $\omega_1$ and $\omega_2$ are frequencies of the two RF input signals.

$$u_{\omega_1-\omega_2}^{(2)} = -L^{-1} \cdot F_{NL,\omega_1-\omega_2}(v^{(1)}) = -L^{-1} \cdot \sum_d F_{NL,\omega_1-\omega_2}^{(d)}(v^{(1)}) \qquad (19)$$

As shown in eq. (19), evaluation of $F_{NL}^{(d)}(v^{(1)})$ takes only linear response $v^{(1)}$ at second order perturbation. Hence, $F_{NL}^{(d)}(v^{(1)})$ is solely due to nonlinearity in device d and no other device is involved in it. The same argument also holds in Volterra series based perturbation.

We apply the adjoint analysis to compute contribution of each device to IM2 at the relevant output nodes. Using transfer function $X_{\omega_1-\omega_2}$, eq. (19) can be rewritten as inner products of $X_{\omega_1-\omega_2}$ and $F_{NL,\omega_1-\omega_2}^{(d)}(v^{(1)})$:

$$V_{out}(\omega_1 - \omega_2) = \sum_d \left(X_{\omega_1-\omega_2}, -F_{NL,\omega_1-\omega_2}^{(d)}(v^{(1)})\right) \qquad (20)$$

where $V_{out}(\omega_1-\omega_2)$ is IM2 measured at the output nodes at frequency $\omega_1-\omega_2$. Note that in this context the transfer function $X_{\omega_1-\omega_2}$ is a projection of the solution operator (e.g., Green's function) onto a combination of one or more output nodes where $V_{out}(\omega_1-\omega_2)$ is being measured (e.g. a difference of voltages at two output nodes). This approach reduces the computational cost since $X_{\omega_1-\omega_2}$ is independent of $F_{NL}$. Once $X_{\omega_1-\omega_2}$ is solved by the linear adjoint analysis, then instead of solving eq. (19) repeatedly, the contribution of element d can be computed by simply calculating the inner product of $X_{\omega_1-\omega_2}$ and $F_{NL,\omega_1-\omega_2}^{(d)}(v^{(1)})$.

Alternatively, the complete solution of eq. (19) can be calculated before making a projection onto the relevant output nodes. However, the solution of eq. (19) is generally only required at a scalar combination of output nodes where the distortion is being measured. Therefore, calculating the IM2 distortion summary according to eq. (20) is generally preferred.

Figure 5:
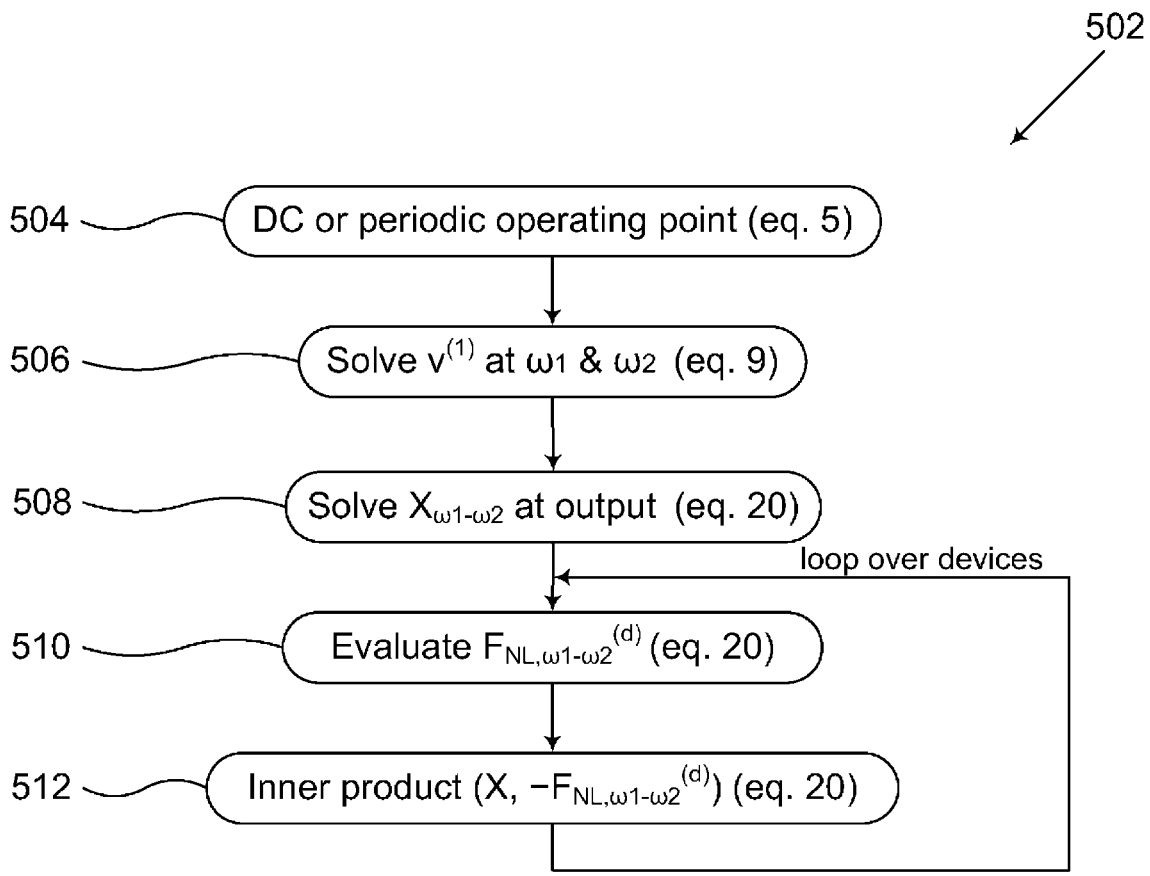
FIG. 5 shows an exemplary method for computing IM2 distortion summaries.

FIG. 5 shows a method for calculating an IM2 distortion summary 502 consistent with the above discussion. First, a DC or operating point is determined 504 (e.g., approximated in the time domain [13] or the frequency domain [16]). Next eq. (9) is solved for the first-order linear response $v^{(1)}$ at $\omega_1$ and $\omega_2$ 506. As noted above, eq. (9) can be solved in the time domain [13] or alternatively in the frequency domain [16] by standard methods. Next the transfer function $X_{\omega_1-\omega_2}$ is characterized as a projection of the solution operator onto the combination of outputs where the distortion is being measured 508. Note that this transfer function $X_{\omega_1-\omega_2}$ can be separately calculated or calculated implicitly when determining the inner products as discussed below 512.

The process then continues for one or more devices (e.g, component elements d of the system 102). The nonlinearities in eq. (20) are evaluated at $\omega_1-\omega_2$ 510, and the inner products are evaluated 512 for characterizing the distortion $V_{out}(\omega_1-\omega_2)$. This process can be continued for all devices in the system 102 or a limited subset of component devices.

Simulation results corresponding to an implementation of this method are shown in FIG. 6. FIG. 6 shows IM2 distortion summary results in V for a direct conversion mixer. Total IM2 at output nodes and contribution of each individual device are listed. Results from time-domain shooting-based and harmonic balance-based implementations are given and they are consistent to each other.

4. Conclusion

Additional embodiments relate to an apparatus for carrying out any one of the above-described methods, where the apparatus may include a computer for executing computer instructions related to the method. In this context the computer may be a general-purpose computer including, for example, a processor, memory, storage, and input/output devices (e.g., monitor, keyboard, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof.

At least some values based on the computed distortion summaries can be saved, either in memory (e.g, RAM (Random Access Memory)) or permanent storage (e.g., a hard-disk system) for later use. For example, values for the left-hand sides of eqs. (11) and (20) can be used directly as distortion summaries. Alternatively, values for components of the right-hand sides of these equations can also be saved for later use. And similarly related values (e.g., averages) can also be saved depending on the requirements of the operational setting.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

5. References

The following references are related to the disclosed subject matter:

[1] J. Bussgang, L. Ehrman, and J. Graham. Analysis of nonlinear systems with multiple inputs. *Proc. IEEE*, 62:1088-1119, August 1974.

[2] S. Chisholm and L. Nagel. Efficient computer simulation of distortion in electronic circuits. *IEEE Trans. on Circuits and Systems*, 20(6):742-745, November 1973.

[3] P. Feldmann, B. Melville, and D. Long. Efficient frequency domain analysis of large nonlinear analog circuits. *Proc. Custom Integrated Circuits Conf.*, pages 461-464, 1996.

[4] J. Haywood and Y. L. Chow. Intermodulation distortion analysis using a frequency-domain harmonic balance technique. *IEEE Trans. on Microwave Theory and Techniques*, 36(8):1251-1257, August 1988.

[5] Y. Kuo. Distortion analysis of bipolar transistor circuits. *IEEE Trans. on Circuits and Systems*, 20(6):709-716, November 1973.

[6] T. Lee. *The Design of CMOS Radio-Frequency Integrated Circuits*. Cambridge University Press, Cambridge, UK, 1998.

[7] B. Leon and D. Schaefer. Volterra series and picard iteration for nonlinear circuits and systems. *IEEE Trans. on Circuits and Systems*, 25(9):789-793, September 1978.

[8] P. Li and L. Pileggi. Efficient per-nonlinearity distortion analysis for analog and rf circuits. *IEEE Trans. on Computer-Aided Design of Integrated Circuits and Systems*, 22(10):1297-1309, October 2003.

[9] S. Maas. *Nonlinear Microwave Circuits*. Artech House, Norwood, Mass., 1988.

[10] S. Narayanan. Application of volterra series to intermodulation distortion analysis of transistor feedback amplifiers. *IEEE Trans. on Circuits and Systems*, 17(4):518-527, November 1970.

[11] B. Razavi. *RF Microelectronics*. Prentice Hall, Upper Saddle River, N.J., 1998.

[12] J. Sakurai. *Modem Quantum Mechanics*. The Benjamin/Cummings Publishing Company, Inc., Menlo Park, Calif., 1985.

[13] R. Telichevesky, K. Kundert, and J. White. Efficient AC and noise analysis of two-tone RF circuits. *Proc. of 33th DAC* pages 292-297, June 96.

[14] P. Wambacq, G. Gielen, P. Kinget, and W. Sansen. High-frequency distortion analysis of analog integrated circuits. *IEEE Trans. on Circuits and Systems II*, 46(3):335-345, March 1999.

[15] F. Yuan and A. Opal. Distortion analysis of periodically switched nonlinear circuits using time-varying Volterra series. *IEEE Trans. on Circuits and Systems I,* 48(6):726-738, June 2001.

[16] D. Long, R. Melville, K. Ashby, and B. Horton. Full-chip Harmonic Balance. *Custom Integrated Circuits Conference, 1997, Proceedings of the IEEE* 1997, 5-8 May 1997, pp. 379-382.

What is claimed is:

1. A method of analyzing distortion in a circuit, comprising:
   determining an operating point for the circuit, the circuit having a linear offset and a nonlinear offset for analyzing distortion at the operating point;
   determining first-order output values by using the linear offset to relate an input having a first frequency and a second frequency with the first-order output values;
   specifying one or more devices for analyzing the circuit;
   determining nonlinear-offset values for the one or more devices at a difference between the first frequency and the second frequency by evaluating the nonlinear offset at values based on the first order-order output values;
   determining contributions to distortion for the one or more devices by projecting the nonlinear-offset values based on the difference between the first frequency and the second frequency; and
   saving at least some values for the contributions to distortion for the one or more devices.

2. The method of claim 1, wherein determining the operating point for the circuit includes approximating the operating point by a time-domain method or a frequency-domain method so that the linear offset defines a linear function for inputs about the operating point and the nonlinear offset defines a nonlinear function for inputs about the operating point.

3. The method of claim 1, further comprising:
   determining a second-order intermodulation (IM2) distortion summary for the one or more devices by combining the contributions to distortion for the one or more devices.

4. The method of claim 3, wherein combining the contributions to distortion for the one or more devices includes summing the contributions to distortion for the one or more devices.

5. The method of claim 1, further comprising:
   determining a transfer function that projects the nonlinear-offset values onto one or more output nodes of the system for calculating the contributions to distortion for the one or more devices.

6. The method of claim 5, wherein projecting the nonlinear-offset values includes calculating one or more inner products between the transfer function and the nonlinear offset values.

7. A non-transitory computer-readable medium that stores a computer program for analyzing distortion in a circuit, wherein the computer program includes instructions for:
   determining an operating point for the circuit, the circuit having a linear offset and a nonlinear offset for analyzing distortion at the operating point;
   determining first-order output values by using the linear offset to relate an input having a first frequency and a second frequency with the first-order output values;
   specifying one or more devices for analyzing the circuit;
   determining nonlinear-offset values for the one or more devices at a difference between the first frequency and the second frequency by evaluating the nonlinear offset at values based on the first order-order output values; and
   determining contributions to distortion for the one or more devices by projecting the nonlinear-offset values based on the difference between the first frequency and the second frequency.

8. The computer-readable medium of claim 7, wherein determining the operating point for the circuit includes approximating the operating point by a time-domain method or a frequency-domain method so that the linear offset defines a linear function for inputs about the operating point and the nonlinear offset defines a nonlinear function for inputs about the operating point.

9. The computer-readable medium of claim 7, wherein the computer program further includes instructions for:
   determining a second-order intermodulation (IM2) distortion summary for the one or more devices by combining the contributions to distortion for the one or more devices.

10. The computer-readable medium of claim 9, wherein combining the contributions to distortion for the one or more devices includes summing the contributions to distortion for the one or more devices.

11. The computer-readable medium of claim 7, wherein the computer program further includes instructions for:
    determining a transfer function that projects the nonlinear-offset values onto one or more output nodes of the system for calculating the contributions to distortion for the one or more devices.

12. The computer-readable medium of claim 11, wherein projecting the nonlinear-offset values includes calculating one or more inner products between the transfer function and the nonlinear offset values.

13. An apparatus for analyzing distortion in a circuit, the apparatus comprising a computer for executing computer instructions, wherein the computer includes computer instructions for:
    determining an operating point for the circuit, the circuit having a linear offset and a nonlinear offset for analyzing distortion at the operating point;
    determining first-order output values by using the linear offset to relate an input having a first frequency and a second frequency with the first-order output values;
    specifying one or more devices for analyzing the circuit;
    determining nonlinear-offset values for the one or more devices at a difference between the first frequency and the second frequency by evaluating the nonlinear offset at values based on the first order-order output values; and
    determining contributions to distortion for the one or more devices by projecting the nonlinear-offset values based on the difference between the first frequency and the second frequency.

14. The apparatus of claim 13, wherein determining the operating point for the circuit includes approximating the operating point by a time-domain method or a frequency-domain method so that the linear offset defines a linear function for inputs about the operating point and the nonlinear offset defines a nonlinear function for inputs about the operating point.

15. The apparatus of claim 13, wherein the computer further includes computer instructions for:
    determining a second-order intermodulation (IM2) distortion summary for the one or more devices by combining the contributions to distortion for the one or more devices.

16. The apparatus of claim 15, wherein combining the contributions to distortion for the one or more devices includes summing the contributions to distortion for the one or more devices.

17. The apparatus of claim 13, wherein the computer further includes computer instructions for:
    determining a transfer function that projects the nonlinear-offset values onto one or more output nodes of the system for calculating the contributions to distortion for the one or more devices.

18. The apparatus of claim 17, wherein projecting the nonlinear-offset values includes calculating one or more inner products between the transfer function and the nonlinear offset values.

19. The apparatus of claim 13, wherein the computer includes a processor with memory for executing at least some of the computer instructions.

20. The apparatus of claim 13, wherein the computer includes circuitry for executing at least some of the computer instructions.

\* \* \* \* \*

UNITED STATES PATENT AND TRADEMARK OFFICE
CERTIFICATE OF CORRECTION

PATENT NO. : 7,979,837 B1
APPLICATION NO. : 12/484865
DATED : July 12, 2011
INVENTOR(S) : Fangyi Rao et al.

It is certified that error appears in the above-identified patent and that said Letters Patent is hereby corrected as shown below:

In column 3, line 60, delete "$V_0$ (t)" and insert -- $V_0(t)$ --, therefor.

In column 3, line 60, delete "$\omega_{LO}$" and insert -- $\omega_{LO}.$ --, therefor.

In column 3, line 67, after "$C_3 V_{RF}^3 +$" insert -- . . . --.

In column 5, line 41, delete "$f(\omega m\omega)_{LO})$" and insert -- $f(\omega + m\omega_{LO})$ --, therefor.

In column 5, line 52, after "3rd" delete "in (and".

In column 8, line 58, delete "Modem" and insert -- Modern --, therefor.

Signed and Sealed this
Thirtieth Day of August, 2011

David J. Kappos
*Director of the United States Patent and Trademark Office*